(12) United States Patent
Yen et al.

(10) Patent No.: US 8,884,323 B2
(45) Date of Patent: Nov. 11, 2014

(54) SEMICONDUCTOR LIGHT-EMITTING DEVICE

(71) Applicant: High Power Opto. Inc., Taichung (TW)

(72) Inventors: Wei-Yu Yen, Taichung (TW); Li-Ping Chou, Taichung (TW); Fu-Bang Chen, Taichung (TW); Chih-Sung Chang, Taichung (TW)

(73) Assignee: High Power Opto. Inc., Taichung (TW)

( * ) Notice: Subject to any disclaimer, the term of this patent is extended or adjusted under 35 U.S.C. 154(b) by 0 days.

(21) Appl. No.: 13/852,042

(22) Filed: Mar. 28, 2013

(65) Prior Publication Data
US 2014/0151711 A1    Jun. 5, 2014

(30) Foreign Application Priority Data
Dec. 4, 2012   (TW) ............................ 101145523 A

(51) Int. Cl.
*H01L 33/00* (2010.01)
*H01L 21/00* (2006.01)
*H01L 33/40* (2010.01)
*H01L 33/44* (2010.01)
*H01L 33/46* (2010.01)

(52) U.S. Cl.
CPC .............. *H01L 33/405* (2013.01); *H01L 33/44* (2013.01); *H01L 33/0079* (2013.01); *H01L 33/46* (2013.01)
USPC ............................................. 257/98; 438/29

(58) Field of Classification Search
CPC ....... H01L 33/405; H01L 33/38; H01L 33/44; H01L 2933/0016; H01L 33/382; H01L 33/387; H01L 33/42; H01L 33/10; H01L 2924/01013; H01L 2924/01028; H01L 33/08; H01L 33/60; H01L 33/641; H01L 2924/01037; H01L 2924/01049; H01L 2924/292

USPC ........... 257/13, 40, 66, 72, 79–103, 223, 227, 257/291, 292, 439, 443, 642–643, 655, 759, 257/918, E27.1, E27.125, E27.112, 257/E29.117, E29.145, E29.147, E29.151, 257/E29.182, E29.202, E29.273–29.299, 257/E29.314, E29.32, E23.016, E21.211, 257/E51.018–E51.022, E33.001–E33.077, 257/E33.054, E25.028, E25.032, 257/E51.001–E51.052, E25.008–E25.009; 438/82, 99, 149, 486, 22–47, 69, 493, 438/503, 507, 956, 43
See application file for complete search history.

(56) References Cited

U.S. PATENT DOCUMENTS

| | | |
|---|---|---|
| 6,242,761 B1 | 6/2001 | Fujimoto et al. |
| 2008/0029758 A1 * | 2/2008 | Kozaki ............................ 257/14 |
| 2011/0193121 A1 * | 8/2011 | Jeong ............................. 257/98 |
| 2011/0198621 A1 * | 8/2011 | Choi et al. ..................... 257/88 |
| 2011/0284896 A1 * | 11/2011 | Park .............................. 257/98 |
| 2012/0298953 A1 * | 11/2012 | Sim ............................... 257/13 |
| 2013/0048944 A1 * | 2/2013 | Won et al. ..................... 257/13 |
| 2013/0234182 A1 | 9/2013 | Katsuno et al. |

* cited by examiner

*Primary Examiner* — Colleen A Matthews
*Assistant Examiner* — Junaiden Mirsalahuddin
(74) *Attorney, Agent, or Firm* — WPAT, PC; Justin King

(57) ABSTRACT

A semiconductor light-emitting device is provided. The semiconductor light-emitting device includes a buffer layer, a light-emitting layer, a first-conductivity semiconductor layer, a first light reflecting layer, a protective structure, and an adhesive layer. The first-conductivity semiconductor layer is disposed between the buffer layer and a first side of the light-emitting layer. The first light reflecting layer is disposed between the first-conductivity semiconductor layer and the buffer layer. The protective structure is disposed between the first reflecting layer and the buffer layer. The adhesive layer is disposed between the first-conductivity semiconductor layer and the protective structure.

11 Claims, 2 Drawing Sheets

SEMICONDUCTOR LIGHT-EMITTING DEVICE

FIELD OF THE INVENTION

The present invention relates to a structure of a semiconductor device, and more particularly to a structure of a semiconductor light-emitting device.

BACKGROUND OF THE INVENTION

Conventionally, the GaN-based light-emitting diode device has a structure of forming a metal light reflecting layer on a back surface of the GaN-based semiconductor structure having a light-emitting layer, thus the light-emitting layer can have enhanced light extraction efficiency. Basically, the metal light-reflecting layer is made by some specific metals, such as silver. However, because the manufacturing environment with high temperature or high humidity, the silver ions in the metal light-reflecting layer may have the migration effect and consequently the metal light reflecting layer may have lower reflection efficiency.

Conventionally, the above-mentioned problems can be fixed by employing a protective structure so surround the metal light-reflecting layer. However, even being capable of preventing the aforementioned migration and oxidation problems from occurring, the conventional protective structure has a poor adhesion degree with the metal light reflecting layer due to the conventional protective structure basically is made metal oxide, and consequently the light-emitting device may have lower reliability.

Thus, there is a need to provide a new structure of light-emitting diode device with an enhance reliability.

SUMMARY OF THE INVENTION

The present invention provides a semiconductor light-emitting device, so as to enhance a reliability of the device.

In order to achieve the aforementioned advantages or other merits, a semiconductor light-emitting device is provided in an embodiment of the present invention. The semiconductor light-emitting device includes a buffer layer, a light-emitting layer, a first-conductivity semiconductor layer, a first light reflecting layer, a protective structure, and an adhesive layer. The first-conductivity semiconductor layer is disposed between the buffer layer and a first side of the light-emitting layer. The first light reflecting layer is disposed between the first-conductivity semiconductor layer and the buffer layer. The protective structure is disposed between the first reflecting layer and the buffer layer. The adhesive layer is disposed between the first-conductivity semiconductor layer and the protective structure.

In an embodiment of the present invention, the first light reflecting layer is arranged to partially contact with the buffer layer, the first light reflecting layer is surrounded with the protective structure.

In an embodiment of the present invention, the adhesive layer is further disposed between the first light reflecting layer and the protective structure.

In an embodiment of the present invention, the first light reflecting layer, the protective structure and the first-conductivity semiconductor layer are arranged to partially contact with the adhesive layer.

In an embodiment of the present invention, the semiconductor light-emitting device further includes a second light reflecting layer disposed between the protective structure and the buffer layer; wherein the second light reflecting layer has a material selected from a group including silver (Ag), aluminum (Al), nickel (Ni) and other metal elements; or the second light reflecting layer is a sliver/titanium tungsten/platinum alloy coating layer, a silver/titanium/platinum alloy coating layer, a silver/titanium/nickel alloy coating layer or a silver/nickel alloy coating layer.

In an embodiment of the present invention, the first light reflecting layer has a material selected from a group including silver (Ag), aluminum (Al), nickel (Ni) and other metal elements; or the first light reflecting layer is a sliver/titanium tungsten/platinum alloy coating layer, a silver/titanium/platinum alloy coating layer, a silver/titanium/nickel alloy coating layer or a silver/nickel alloy coating layer.

In an embodiment of the present invention, the buffer layer has a multi-layer structure constituted by any two of titanium (Ti), tungsten (W), platinum (Pt), nickel (Ni) and titanium tungsten (TiW).

In an embodiment of the present invention, the protective structure has a material selected from a group including silicon dioxide ($SiO_2$), titanium dioxide ($TiO_2$), indium tin oxide (SnInO), nitride silicon (SiN), aluminum oxide ($Al_2O_3$) and distributed Bragg reflector (DBR) material or a combination thereof.

In an embodiment of the present invention, the adhesive layer has a material selected from a group including titanium tungsten (TiW), titanium (Ti) and aluminum (Al).

In an embodiment of the present invention, the first-conductivity semiconductor layer is a p-type gallium nitride (GaN) semiconductor layer.

In an embodiment of the present invention, the semiconductor light-emitting device further includes a second-conductivity semiconductor layer disposed on a second side of the light-emitting layer, wherein the second-conductivity semiconductor layer is an N-type gallium nitride (GaN) semiconductor layer.

In summary, according to the present invention, the adhesive layer is disposed between the first-conductivity semiconductor layer and the buffer layer to enhance a bonding strength between the protective structure and the first light reflecting layer and between the protective structure and the first-conductivity semiconductor layer, so as to solve problems resulted from poor reliability of traditional semiconductor light-emitting devices.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
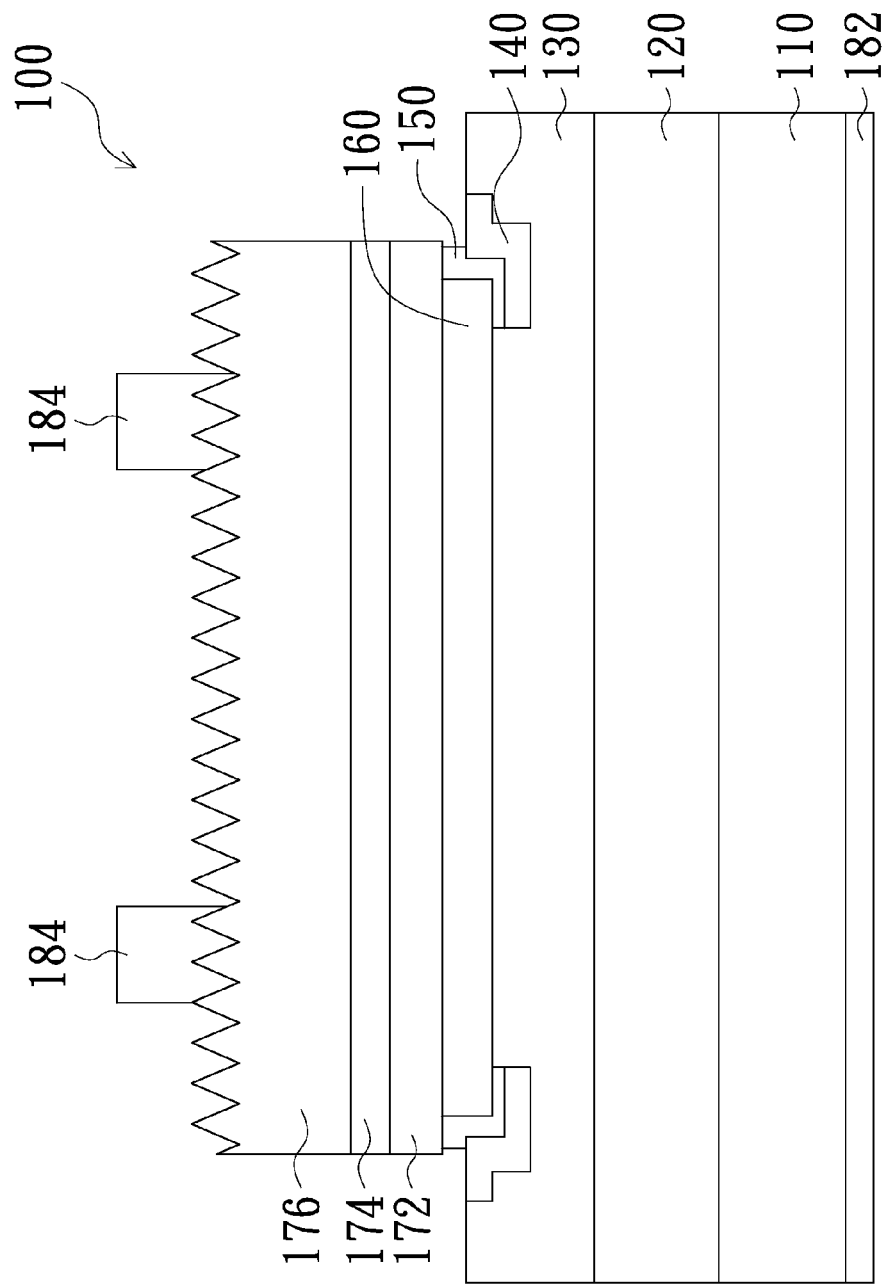
FIG. 1 is a schematic diagram illustrating a structure of a semiconductor light-emitting device in accordance with an embodiment of the present invention.

FIG. 1 is a schematic diagram illustrating a structure of a semiconductor light-emitting device in accordance with an embodiment of the present invention. As shown, the semiconductor light-emitting device 100 in this embodiment sequentially includes a first electrode layer 182, a substrate 110, a bonding layer 120, a buffer layer 130, a protective structure 140, a adhesive layer 150, a first light reflecting layer 160, a first-conductivity semiconductor layer 172, a light-emitting layer 174, a second-conductivity semiconductor layer 176 and a second electrode layer 184.

The substrate 110 and the bonding layer 120 are disposed between the first electrode layer 182 and the buffer layer 130. The substrate 110 is arranged to contact with the first electrode layer 182 by one side thereof and contact with the bonding layer 120 the opposite side thereof. The bonding layer 120 is arranged to contact with the buffer layer 130 by one side thereof, which is the one farthest away the substrate 110. The bonding layer 120 is, for example, a multilayer structure constituted by titanium (Ti)/gold (Au)/indium (In), and configured to bond the substrate 110 and the buffer layer 130. The substrate 110 is a permanent substrate, e.g., a silicon substrate with conductivity. The first electrode layer 182 is, for example, a p-type electrode.

The first-conductivity semiconductor layer 172 is disposed between the buffer layer 130 and the light-emitting layer 174. The first light reflecting layer 160, disposed between the first-conductivity semiconductor layer 172 and the buffer layer 130, is configured to reflect the light emitting from the light-emitting layer 174. The second-conductivity semiconductor layer 176 is disposed on one side, the one farthest away the first-conductivity semiconductor layer 172, of the light-emitting layer 174. The first-conductivity semiconductor layer 172 is, for example, a p-type gallium nitride (GaN) semiconductor layer. The second-conductivity semiconductor layer 176 is, for example, an n-type gallium nitride semiconductor layer. In addition, the second electrode layer 184 is disposed on one side, the one farthest away the light-emitting layer 174, of the second-conductivity semiconductor layer 176. The second electrode layer 184 is, for example, a n-type electrode. It is to be noted that one side, the one farthest away the light-emitting layer 174, of the second-conductivity semiconductor layer 176 is a rough surface; thus, the light scattering amount on this side is enhanced. The buffer layer 130 has a metal material with conductivity and proper stability; wherein the metal material has a thermal expansion coefficient located between that of CaN and Si. Therefore, the metal material having the above-mentioned properties is used as a buffer layer disposed between a GaN semiconductor layer and a Si substrate. The buffer layer 130 is, for example, a multi-layer structure constituted by any two of titanium (Ti), tungsten (W), platinum (Pt), nickel (Ni) and titanium tungsten (TiW).

In addition, the first light reflecting layer 160 is, for example, a sliver/titanium tungsten/platinum alloy coating layer; wherein the silver has a thickness of 100~300 nm, the titanium tungsten has a thickness of 200~300 nm, the platinum has a thickness less than 500 nm, for example. Or, the first light reflecting layer 160 is, for example, a silver/titanium/platinum alloy coating layer, a silver/titanium/nickel alloy coating layer, or a silver/nickel alloy coating layer; wherein the silver has a thickness of 200~300 nm, the titanium has a thickness of 200~300 nm, and the platinum or nickel has a thickness less than 500 nm, for example. Or, the first light reflecting layer 160 has a material selected from a group including silver (Ag), aluminum (Al), nickel (Ni) and other metal elements for example.

The protective structure 140 is disposed between the first light reflecting layer 160 and the buffer layer 130. In a preferred embodiment, the first light reflecting layer 160 is arranged to partially contact with the buffer layer 130, and the first light reflecting layer 160 is surrounded with the protective structure 140. The protective structure 140 and the buffer layer 130 are configured to corporately protect the first light reflecting layer 160, so as to prevent the first light reflecting layer 160 from being oxidized in the subsequent process as well as prevent the metals in the first light reflecting layer 160 from being separated in a high-current operation process. Therefore, not only the first light reflecting layer 160 can have maintained reflectance, but also the first light reflecting layer 160 can sufficiently reflect the light emitting from the light-emitting layer 174; thus, the semiconductor light-emitting device 100 has enhanced light-extraction efficiency and electrical stability. The protective structure 140 has a material selected from a group including silicon dioxide ($SiO_2$), titanium dioxide ($TiO_2$), indium tin oxide (SnInO), nitride silicon (SiN), aluminum oxide ($Al_2O_3$) and distributed Bragg reflector (DBR) material or a combination thereof, which have stable and non-easy changed physical properties; wherein the protective structure 140 has a thickness of 200 nm, for example.

Moreover, the adhesive layer 150 is disposed between the first-conductivity semiconductor layer 172 and the protective structure 140 as well as disposed between the first light reflecting layer 160 and the protective structure 140. In other words, the first light reflecting layer 160, the protective structure 140, and the first-conductivity semiconductor layer 172 each are arranged to partially contact with the adhesive layer 150. The adhesive layer 150 has a material selected from a group including titanium tungsten (TiW), titanium (Ti) and aluminum (Al). The adhesive layer 150 is configured to enhance a bonding strength between the protective structure 140 and the first light reflecting layer 160 as well as a bonding strength between the protective structure 140 and the first-conductivity semiconductor layer 172. Thus, the semiconductor light-emitting device 100 has enhanced reliability.

Figure 2:
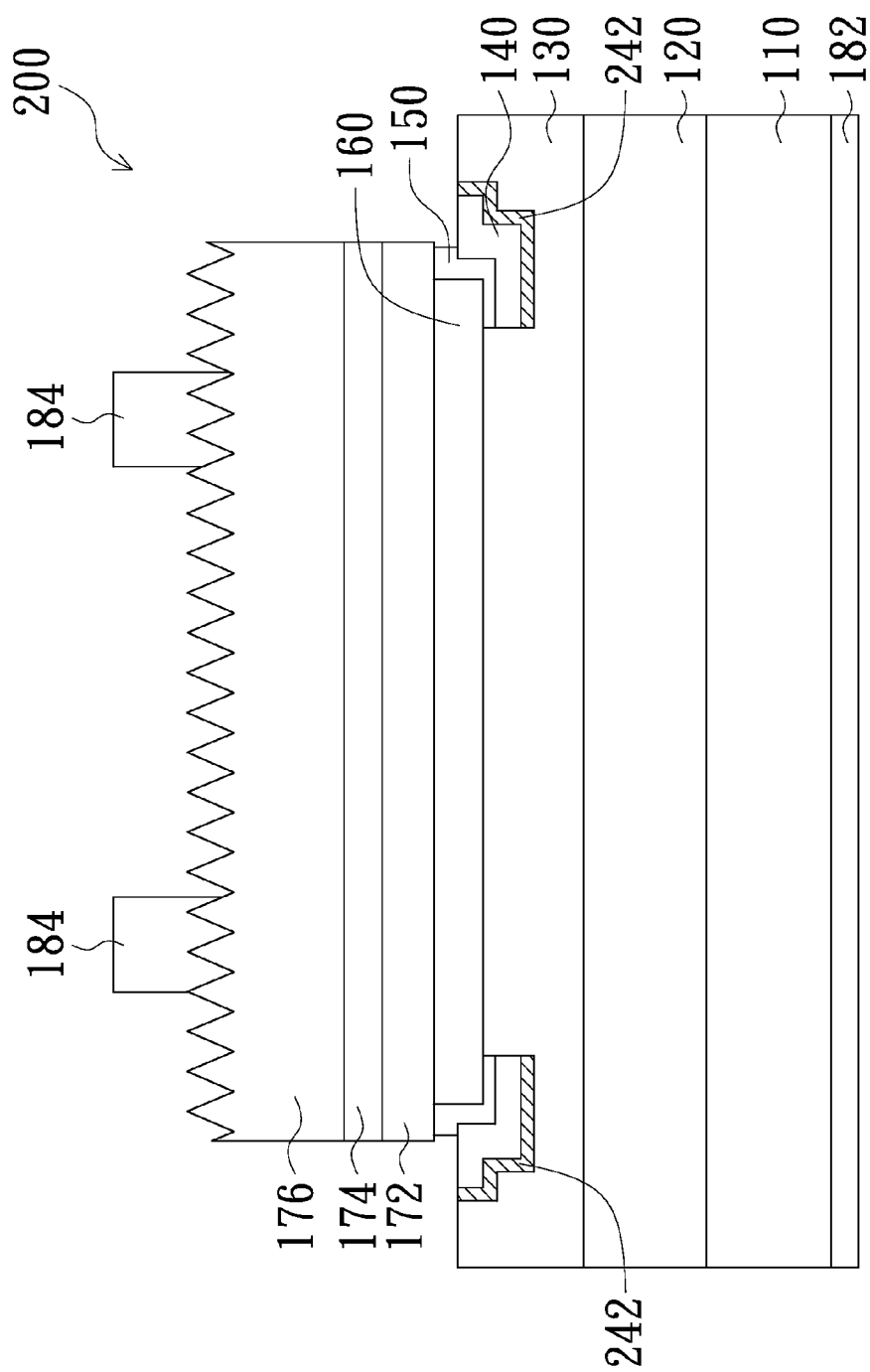
FIG. 2 is a schematic diagram illustrating a structure of a semiconductor light-emitting device in accordance with another embodiment of the present invention.

FIG. 2 is a schematic diagram illustrating a structure of a semiconductor light-emitting device in accordance with another embodiment of the present invention. As shown, the light-emitting device 200 in this embodiment has a structure similar to that of the semiconductor light-emitting device 100; and the main difference between the two is that the semiconductor light-emitting device 200 further includes a second light reflecting layer 242. Thus, no redundant detail is to be given herein for those components included both in the semiconductor light-emitting devices 200 and 100.

It is to be noted that the second light reflecting layer 242, disposed between the protective structure 140 and the buffer layer 130, is configured to reflect light emitting from the light-emitting layer 174 and incident to the protective structure 140; thus, the light emitting from the light-emitting layer 174 is prevented from leaking from a non light reflecting area (i.e. the adhesive layer 150 and the protective structure 140) disposed near to an edge of the first light reflecting layer 160 and consequently the light extraction efficiency of the light-emitting layer 174 enhances. In addition, the second light reflecting layer 242 has a material selected from a group including silver (Ag), aluminum (Al), nickel (Ni) and other metal elements; or the second light reflecting layer 242 is a sliver/titanium tungsten/platinum alloy coating layer, a silver/ titanium/platinum alloy coating layer, a silver/titanium/nickel alloy coating layer or a silver/nickel alloy coating layer.

In summary, by disposing the adhesive layer between the first-conductivity semiconductor layer and the buffer layer, the present invention can have an enhanced bonding strength between the protective structure and the first light reflecting layer as well as that between the protective structure and the first-conductivity semiconductor layer. Thus, the poor reliability issue resulted in the conventional semiconductor light-emitting device is prevented from occurring.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor light-emitting device, comprising:
   a buffer layer;
   a light-emitting layer;
   a first-conductivity semiconductor layer disposed between the buffer layer and a first side of the light-emitting layer;
   a first light reflecting layer disposed between the first-conductivity semiconductor layer and the buffer layer, and arranged to partially contact with the buffer layer;
   a protective structure disposed between the first light reflecting layer and the buffer layer, wherein a portion of the first light reflecting layer is covered with the protective structure; and
   an adhesive layer disposed between the first-conductivity semiconductor layer and the protective structure.

2. The semiconductor light-emitting device according to claim 1, wherein the adhesive layer is further disposed between the first light reflecting layer and the protective structure.

3. The semiconductor light-emitting device according to claim 2, wherein the first light reflecting layer, the protective structure and the first-conductivity semiconductor layer are arranged to partially contact with the adhesive layer.

4. The semiconductor light-emitting device according to claim 1, further comprising a second light reflecting layer disposed between the protective structure and the buffer layer.

5. The semiconductor light-emitting device according to claim 4, wherein the second light reflecting layer has a material selected from a group including silver (Ag), aluminum (Al), nickel (Ni) and other metal elements; or the second light reflecting layer is a sliver/titanium tungsten/platinum alloy coating layer, a silver/titanium/platinum alloy coating layer, a silver/titanium/nickel alloy coating layer or a silver/nickel alloy coating layer.

6. The semiconductor light-emitting device according to claim 1, wherein the first light reflecting layer has a material selected from a group including silver (Ag), aluminum (Al), nickel (Ni) and other metal elements; or the first light reflecting layer is a sliver/titanium tungsten/platinum alloy coating layer, a silver/titanium/platinum alloy coating layer, a silver/titanium/nickel alloy coating layer or a silver/nickel alloy coating layer.

7. The semiconductor light-emitting device according to claim 1, wherein the buffer layer has a multi-layer structure constituted by any two of titanium (Ti), tungsten (W), platinum (Pt), nickel (Ni), aluminum (Al) and titanium tungsten (TiW).

8. The semiconductor light-emitting device according to claim 1, wherein the protective structure has a material selected from a group including silicon dioxide ($SiO_2$), titanium dioxide ($TiO_2$), indium tin oxide (SnInO), nitride silicon (SiN), aluminum oxide ($Al_2O_3$) and distributed Bragg reflector (DBR) material or a combination thereof.

9. The semiconductor light-emitting device according to claim 1, wherein the adhesive layer has a material selected from a group including titanium tungsten (TiW), titanium (Ti) and aluminum (Al).

10. The semiconductor light-emitting device according to claim 1, wherein the first-conductivity semiconductor layer is a p-type gallium nitride (GaN) semiconductor layer.

11. The semiconductor light-emitting device according to claim 1, further comprising a second-conductivity semiconductor layer disposed on a second side of the light-emitting layer, wherein the second-conductivity semiconductor layer is an N-type gallium nitride (GaN) semiconductor layer.

* * * * *